United States Patent
Camacho

(10) Patent No.: US 8,921,161 B2
(45) Date of Patent: *Dec. 30, 2014

(54) SEMICONDUCTOR DEVICE AND METHOD OF FORMING EWLB PACKAGE CONTAINING STACKED SEMICONDUCTOR DIE ELECTRICALLY CONNECTED THROUGH CONDUCTIVE VIAS FORMED IN ENCAPSULANT AROUND DIE

(71) Applicant: STATS ChipPAC, Ltd., Singapore (SG)

(72) Inventor: Zigmund R. Camacho, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/732,150

(22) Filed: Dec. 31, 2012

(65) Prior Publication Data

US 2013/0119559 A1     May 16, 2013

Related U.S. Application Data

(63) Continuation of application No. 13/116,328, filed on May 26, 2011, now Pat. No. 8,389,333.

(51) Int. Cl.
| | |
|---|---|
| H01L 21/00 | (2006.01) |
| H01L 23/02 | (2006.01) |
| H01L 25/065 | (2006.01) |
| H01L 21/56 | (2006.01) |
| H01L 23/498 | (2006.01) |
| H01L 23/31 | (2006.01) |
| H01L 23/00 | (2006.01) |

(52) U.S. Cl.
CPC ........... *H01L 21/56* (2013.01); *H01L 2224/821* (2013.01); *H01L 23/3128* (2013.01);

(Continued)

(58) Field of Classification Search
CPC .............. H01L 25/0657; H01L 21/561; H01L 23/5389; H01L 23/3107; H01L 21/56; H01L 23/481; H01L 25/072; H01L 23/4811; H01L 21/565; H01L 24/19; H01L 24/82; H01L 23/49827; H01L 24/24; H01L 24/96; H01L 24/97; H01L 24/92
See application file for complete search history.

(56) References Cited

U.S. PATENT DOCUMENTS

| 7,045,391 B2 | 5/2006 | Lin |
| 7,781,877 B2 * | 8/2010 | Jiang et al. .................... 257/686 |

(Continued)

*Primary Examiner* — Alonzo Chambliss

(74) *Attorney, Agent, or Firm* — Robert D. Atkins; Patent Law Group: Atkins and Associates, P.C.

(57) ABSTRACT

A semiconductor device has a first semiconductor die and first encapsulant deposited around the first semiconductor die. A first insulating layer is formed over the first semiconductor die and first encapsulant. A first conductive layer is formed over the first insulating layer and electrically connected to a contact pad of the first semiconductor die. A second semiconductor die is mounted to the first insulating layer and first conductive layer. A second encapsulant is deposited around the second semiconductor die. A second insulating layer is formed over the second semiconductor die and second encapsulant. A second conductive layer is formed over the second insulating layer and electrically connected to a contact pad of the second semiconductor die. A plurality of conductive vias is formed continuously through the first and second encapsulants outside a footprint of the first and second semiconductor die electrically connected to the first and second conductive layers.

27 Claims, 12 Drawing Sheets

(52) U.S. Cl.
CPC ... *H01L 2924/01049* (2013.01); H01L 25/0657 (2013.01); *H01L 2224/24011* (2013.01); *H01L 24/25* (2013.01); *H01L 2924/01079* (2013.01); *H01L 2924/01082* (2013.01); H01L 24/24 (2013.01); H01L 21/561 (2013.01); *H01L 2224/12105* (2013.01); *H01L 2924/01047* (2013.01); *H01L 2224/82039* (2013.01); *H01L 2224/48091* (2013.01); H01L 23/49827 (2013.01); *H01L 2224/24105* (2013.01); H01L 24/92 (2013.01); H01L 24/82 (2013.01); *H01L 2924/13091* (2013.01); *H01L 2224/32145* (2013.01); *H01L 2924/014* (2013.01); *H01L 2924/01073* (2013.01); *H01L 2924/01074* (2013.01); *H01L 2224/04105* (2013.01); H01L 24/96 (2013.01); *H01L 2224/73267* (2013.01); *H01L 2224/82031* (2013.01); *H01L 2924/01029* (2013.01); *H01L 2224/131* (2013.01); *H01L 2225/1035* (2013.01); H01L 24/97 (2013.01); *H01L 2224/16225* (2013.01); *H01L 24/19* (2013.01); *H01L 2224/96* (2013.01); *H01L 2224/92244* (2013.01); *H01L 2924/01322* (2013.01); *H01L 2924/15311* (2013.01); H01L 21/565 (2013.01); *H01L 2224/24146* (2013.01); *H01L 2924/01013* (2013.01); *H01L 2224/73265* (2013.01); *H01L 2224/245* (2013.01)

USPC .......... 438/112; 438/126; 438/127; 257/686; 257/724; 257/774; 257/787

(56) References Cited

U.S. PATENT DOCUMENTS

| | | | | |
|---|---|---|---|---|
| 7,855,462 | B2 | 12/2010 | Boon et al. | |
| 7,858,440 | B2 | 12/2010 | Pressel et al. | |
| 8,389,333 | B2* | 3/2013 | Camacho | 438/112 |
| 2007/0035015 | A1* | 2/2007 | Hsu | 257/723 |
| 2008/0029850 | A1 | 2/2008 | Hedler et al. | |
| 2009/0039523 | A1* | 2/2009 | Jiang et al. | 257/777 |
| 2009/0079090 | A1 | 3/2009 | Pressel et al. | |
| 2009/0140408 | A1 | 6/2009 | Lee et al. | |
| 2009/0243045 | A1* | 10/2009 | Pagaila et al. | 257/621 |
| 2010/0320585 | A1* | 12/2010 | Jiang et al. | 257/686 |
| 2012/0211892 | A1* | 8/2012 | Kim et al. | 257/774 |

* cited by examiner

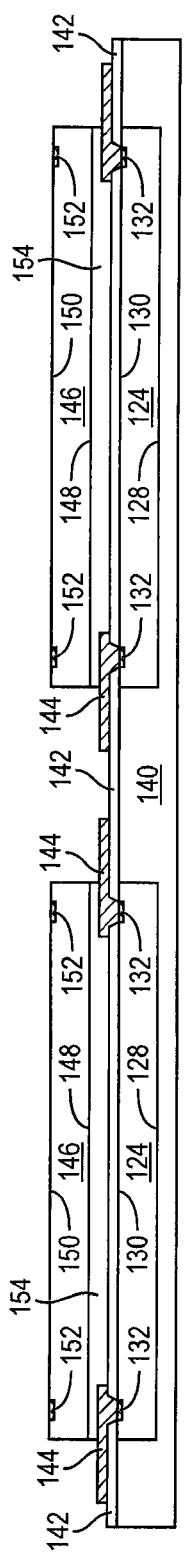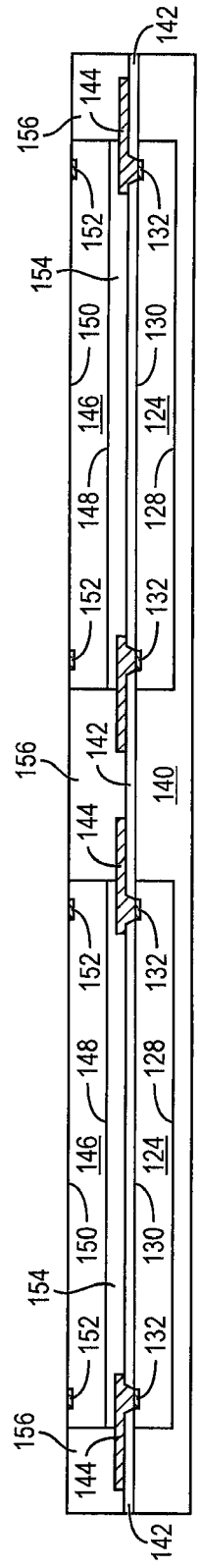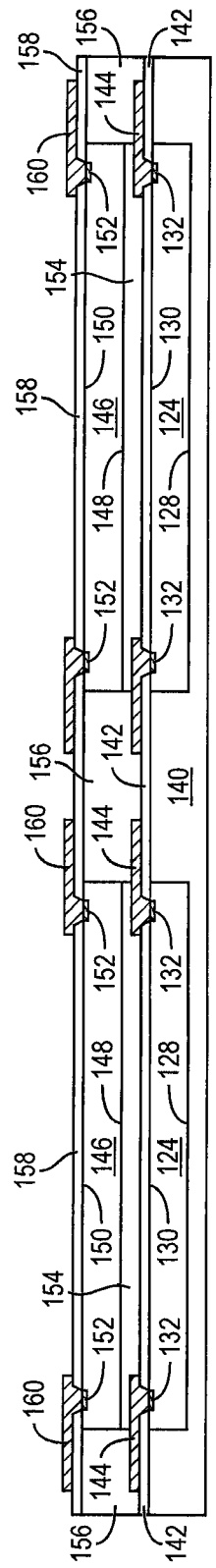

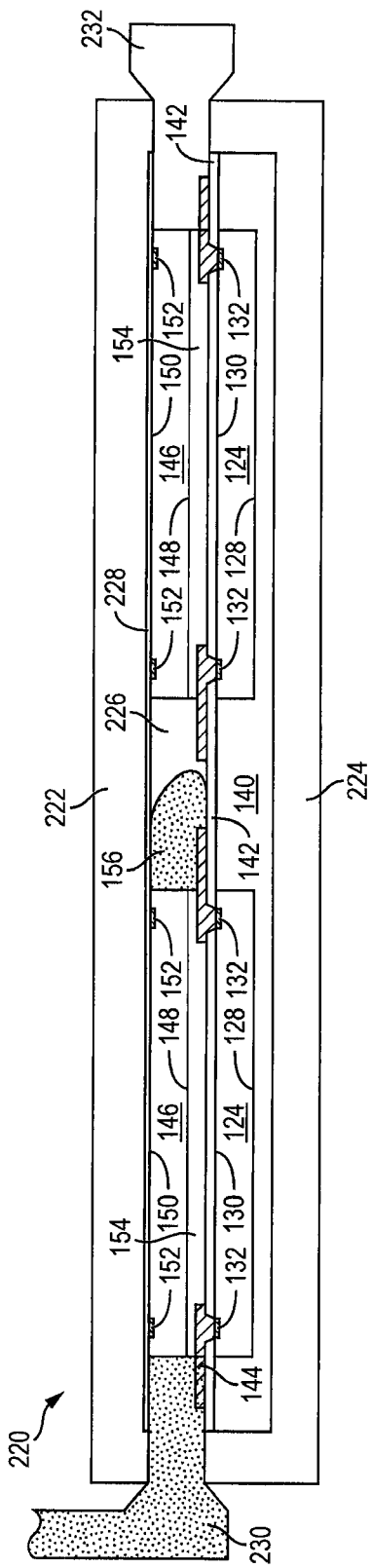
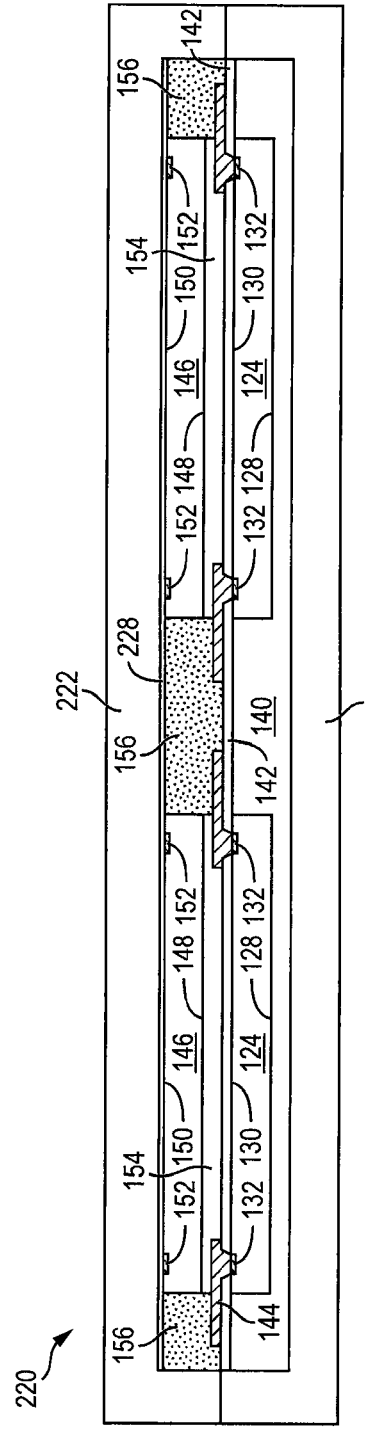
FIG. 8a
FIG. 8b

SEMICONDUCTOR DEVICE AND METHOD OF FORMING EWLB PACKAGE CONTAINING STACKED SEMICONDUCTOR DIE ELECTRICALLY CONNECTED THROUGH CONDUCTIVE VIAS FORMED IN ENCAPSULANT AROUND DIE

CLAIM TO DOMESTIC PRIORITY

The present application is a continuation of U.S. patent application Ser. No. 13/116,328, now U.S. Pat. No. 8,389,333, filed May 26, 2011, which application is incorporated herein by reference.

FIELD OF THE INVENTION

The present invention relates in general to semiconductor devices and, more particularly, to a semiconductor device and method of forming an eWLB semiconductor package containing stacked semiconductor die electrically connected through conductive vias formed in an encapsulant around each of the semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Semiconductor die are commonly stacked or otherwise require vertical z-direction interconnect capability. The stacked semiconductor die are electrically connected with bond wires, bumps, or conductive vias formed through the semiconductor die or encapsulant. The vertical interconnect between semiconductor die consumes space and increases the overall height of the package, as well as imposing higher manufacturing costs.

SUMMARY OF THE INVENTION

A need exists to form a simple and cost-effective vertical electrical interconnect structure for stacked semiconductor die. Accordingly, in one embodiment, the present invention is a method of making a semiconductor device comprising the steps of providing a first semiconductor die, depositing a first encapsulant around the first semiconductor die, forming a first conductive layer over the first encapsulant, disposing a second semiconductor die over the first semiconductor die, depositing a second encapsulant around the second semiconductor die, and forming a second conductive layer over the second encapsulant.

In another embodiment, the present invention is a method of making a semiconductor device comprising the steps of providing a first semiconductor die, disposing a second semiconductor die over the first semiconductor die, depositing an encapsulant around the first semiconductor die and second semiconductor die, and forming a plurality of conductive vias through the encapsulant.

In another embodiment, the present invention is a semiconductor device comprising a first semiconductor die and first encapsulant deposited around the first semiconductor die. A first conductive layer is formed over the first encapsulant. A second semiconductor die is disposed over the first semiconductor die. A second encapsulant is deposited around the second semiconductor die. A second conductive layer is formed over the second encapsulant.

In another embodiment, the present invention is a semiconductor device comprising a first semiconductor die and second semiconductor die disposed over the first semiconductor die. An encapsulant is deposited around the first semiconductor die and second semiconductor die. A plurality of conductive vias is formed through the encapsulant.

BRIEF DESCRIPTION OF THE DRAWINGS

FIGS. 8a-8b illustrate a chase mold for depositing an encapsulant around the stacked semiconductor die.

DETAILED DESCRIPTION OF THE DRAWINGS

Figure 1:
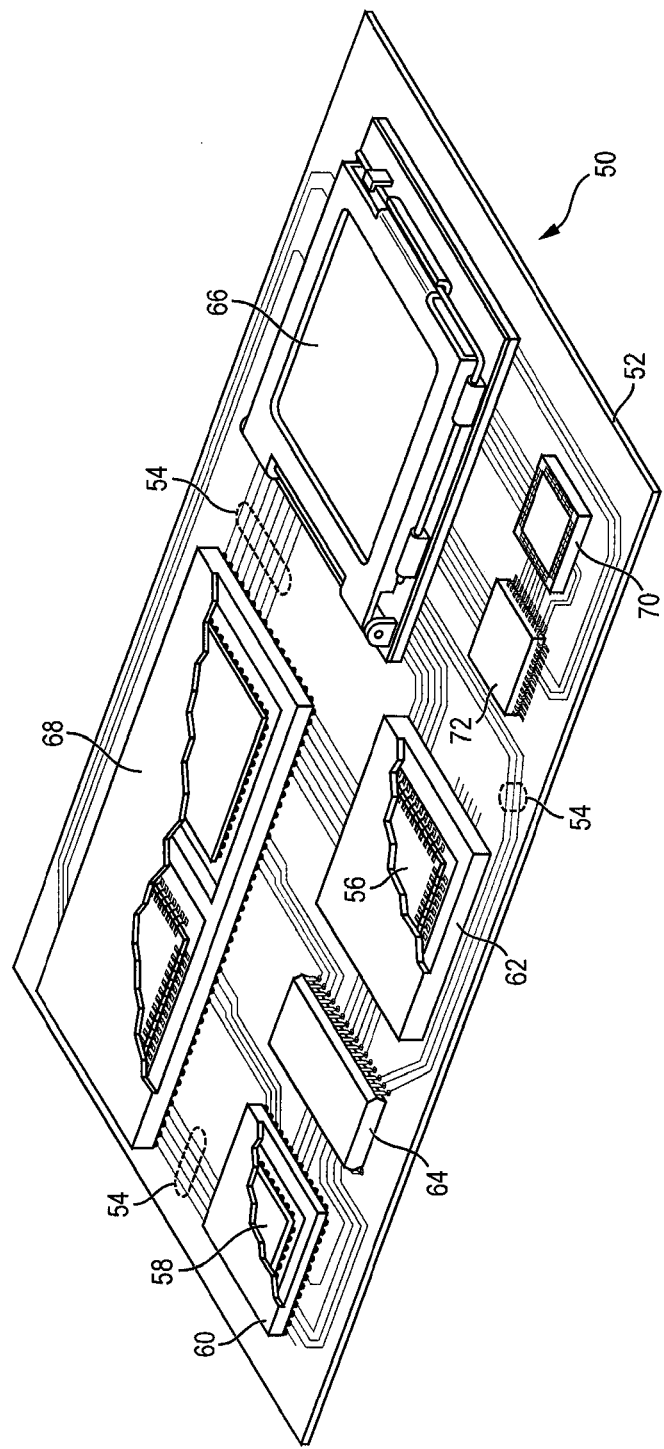
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
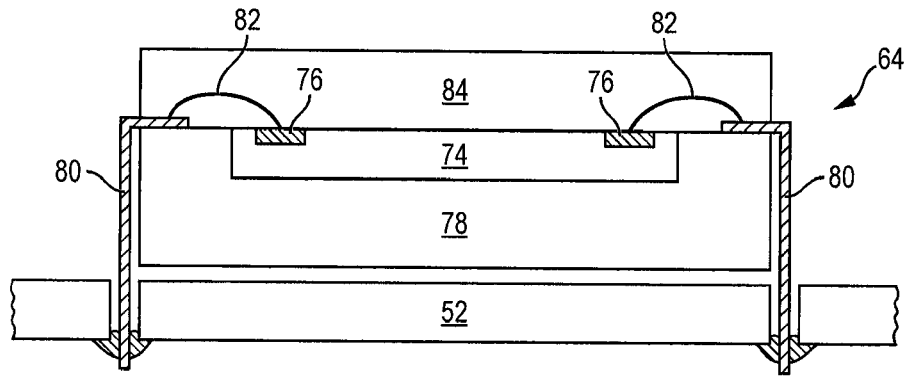
FIGS. 2a-2c illustrate further detail of the representative semiconductor packages mounted to the PCB.
Figure 2B:
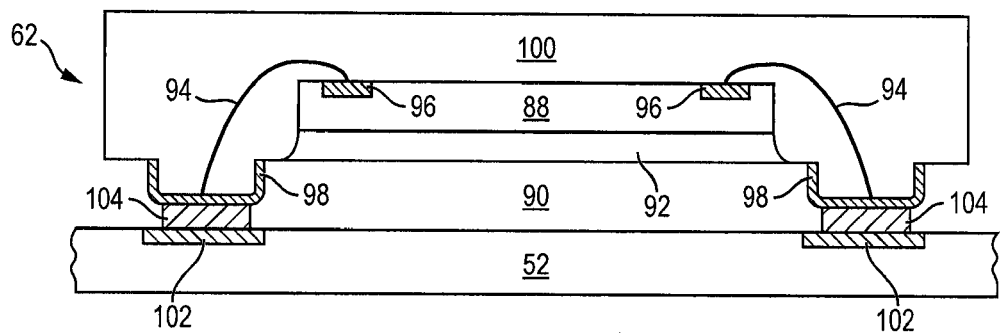
Figure 2C:
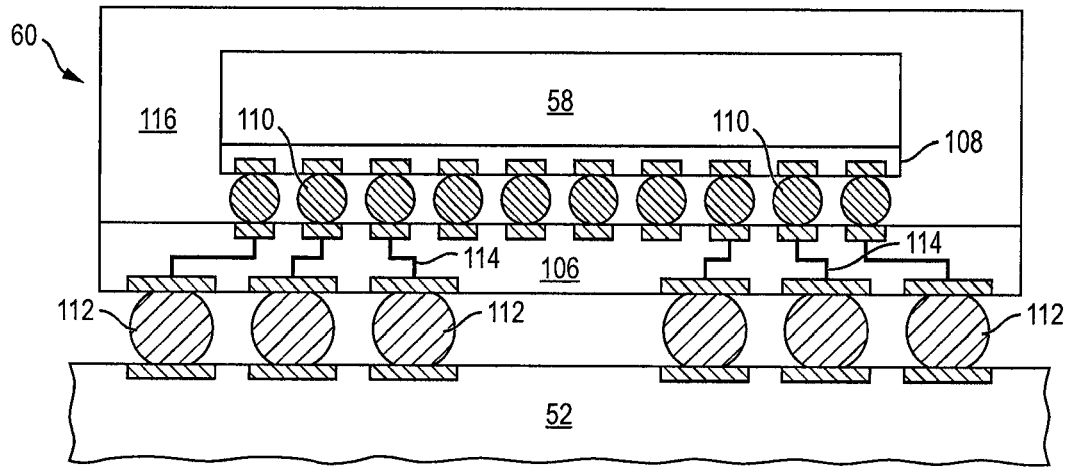

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted to carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
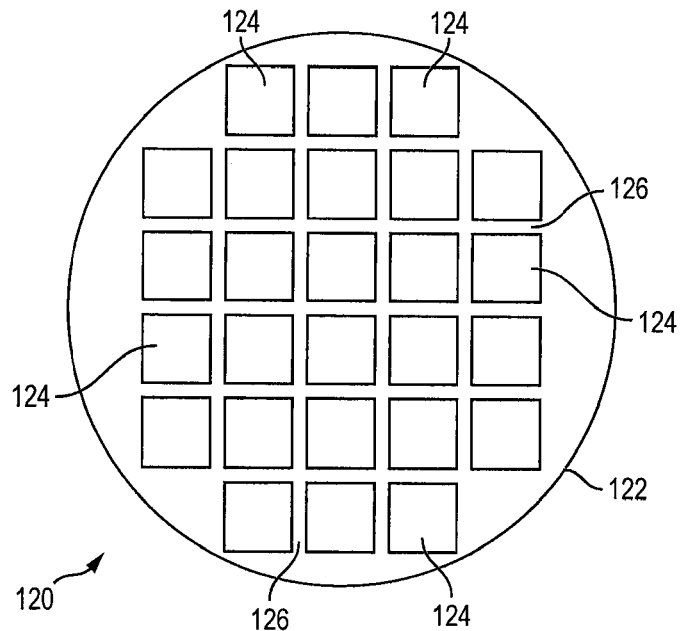
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
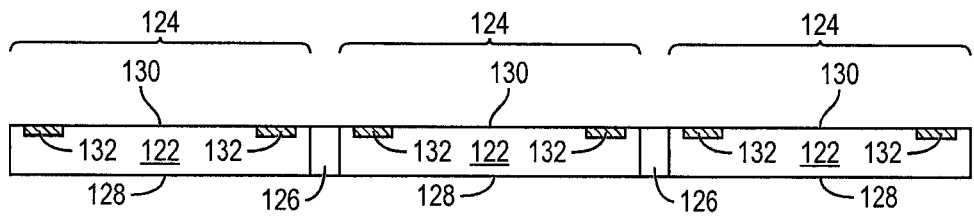

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124. Alternatively, contact pads 132 can be offset in multiple rows such that a first row of contact pads is disposed a first distance from the edge of the die, and a second row of contact pads alternating with the first row is disposed a second distance from the edge of the die.

Figure 3C:
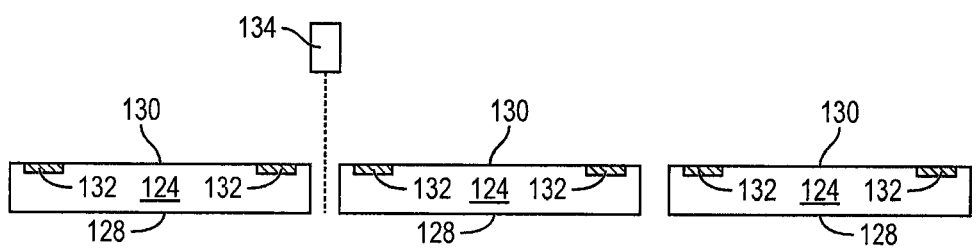

In FIG. 3c, semiconductor wafer 120 is singulated through saw street 126 using a saw blade or laser cutting tool 134 into individual semiconductor die 124.

Figure 4A:
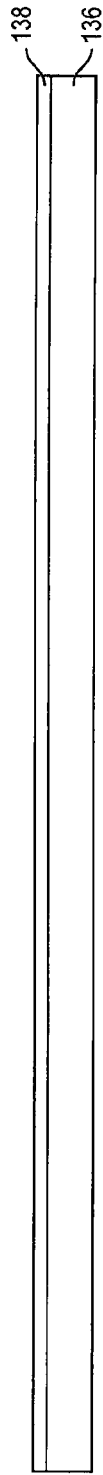
FIGS. 4a-4s illustrate a process of forming an eWLB package containing stacked semiconductor die electrically connected through conductive vias formed in an encapsulant around each of the semiconductor die.
Figure 4B:
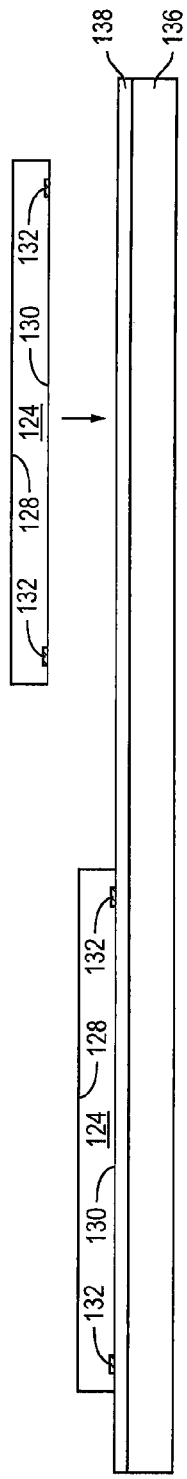
Figure 4C:
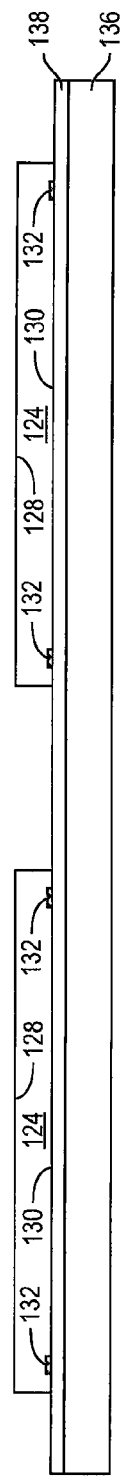
Figure 4D:
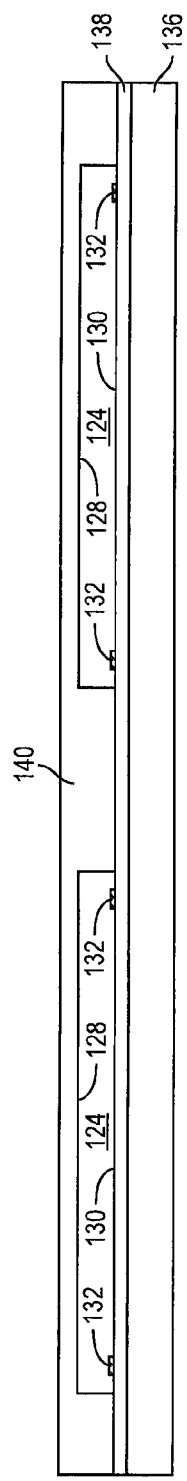
Figure 4E:
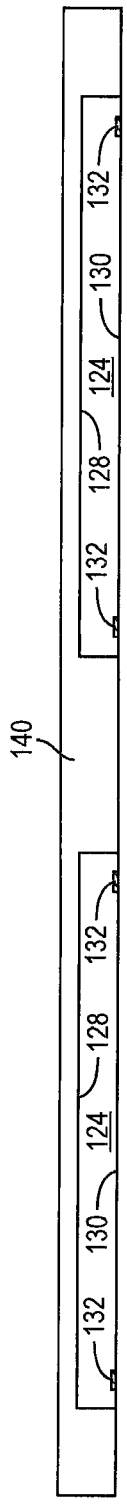
Figure 4F:
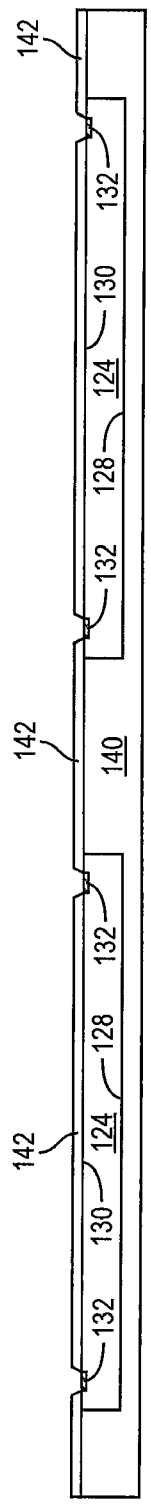
Figure 4G:
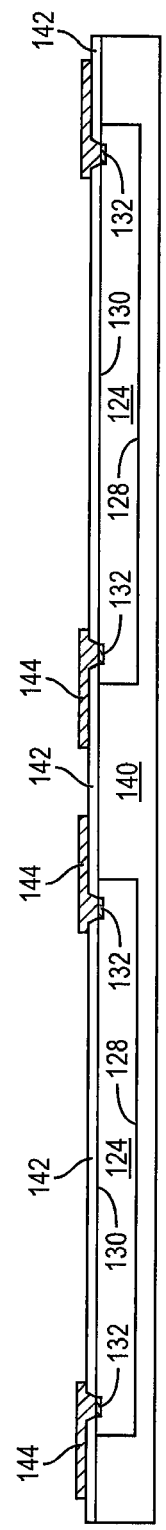
Figure 4H:
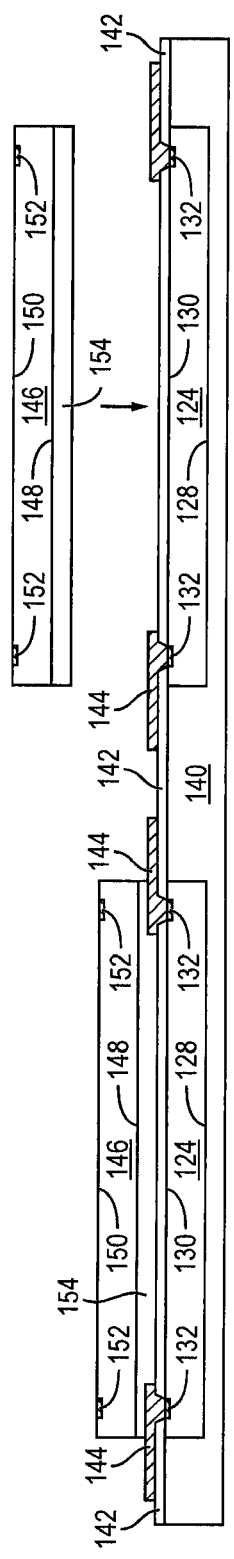
Figure 4L:
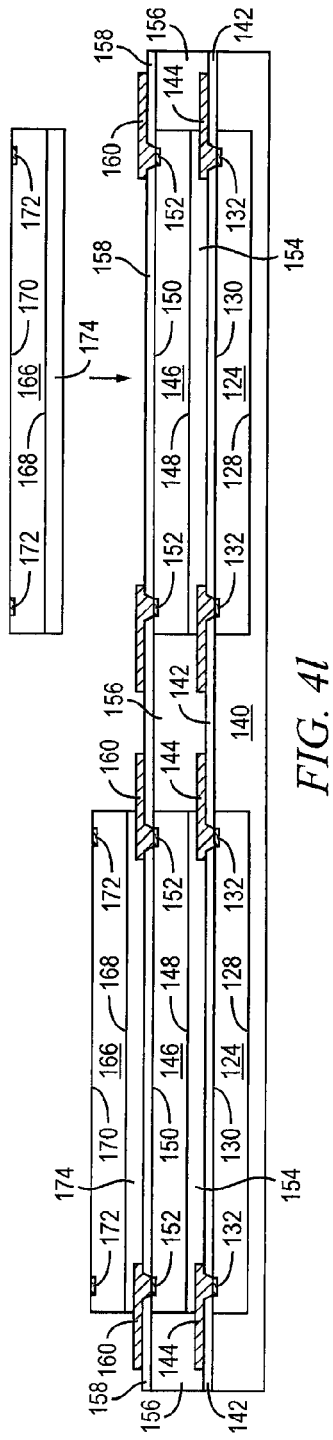
Figure 4M:
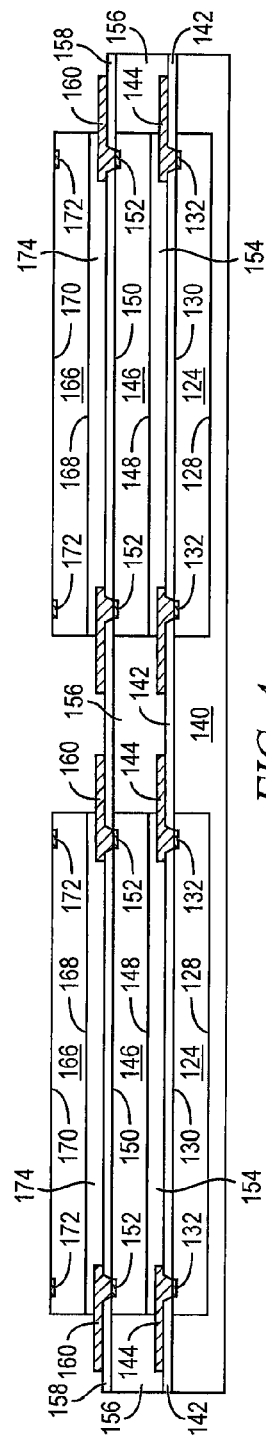
Figure 4N:
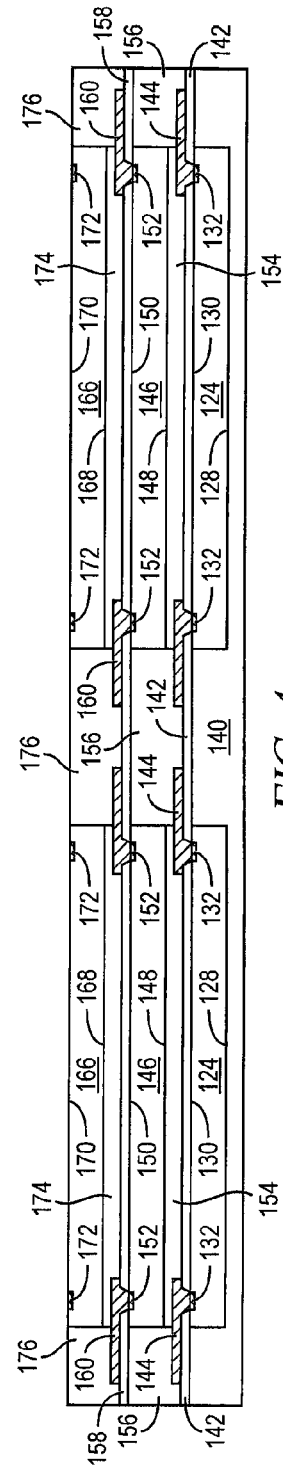
Figure 4O:
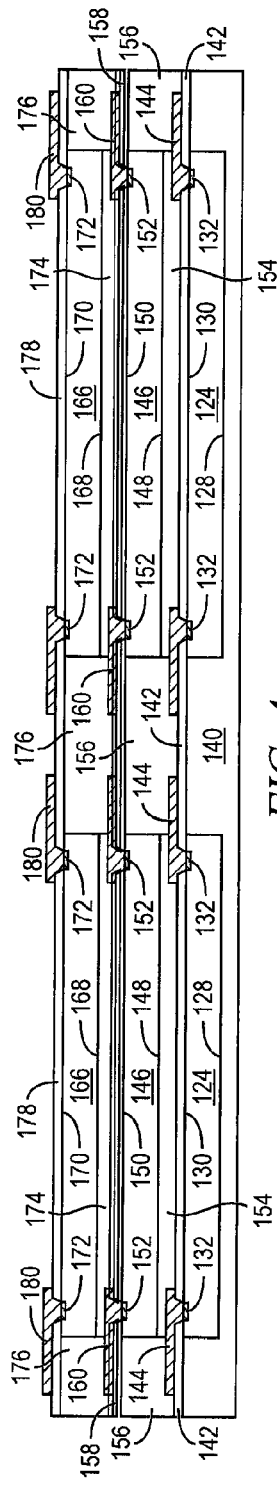
Figure 4P:
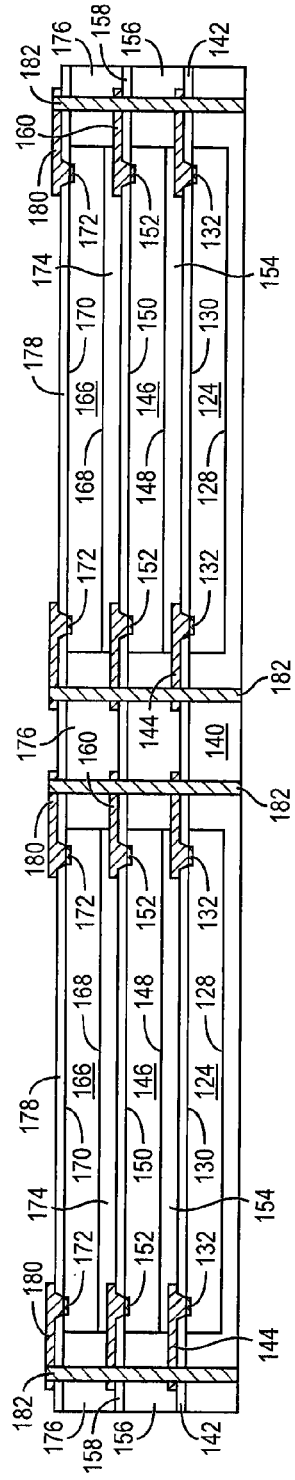
Figure 4Q:
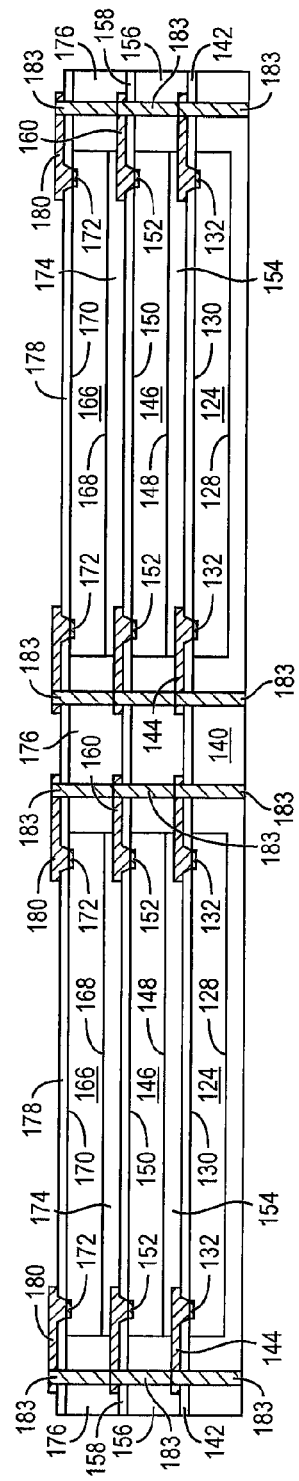
Figure 4R:
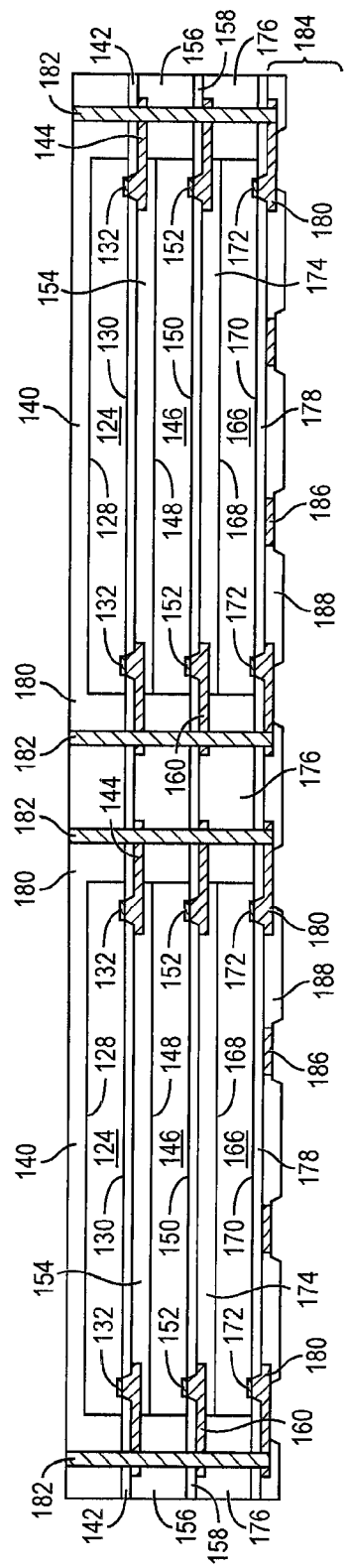
Figure 4S:
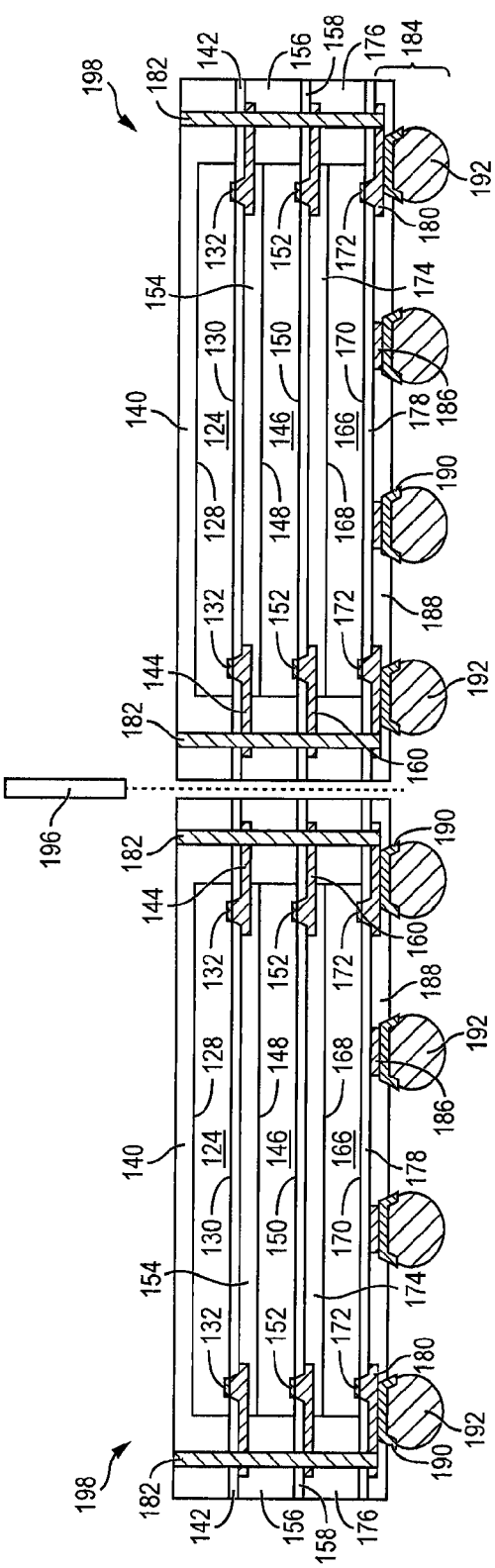

FIGS. 4a-4s illustrate, in relation to FIGS. 1 and 2a-2c, a process of forming an eWLB semiconductor package containing stacked semiconductor die electrically connected through conductive vias formed in an encapsulant around each of the semiconductor die. In FIG. 4a, a substrate or carrier 136 contains temporary or sacrificial base material such as silicon, polymer, beryllium oxide, or other suitable low-cost, rigid material for structural support. An interface layer or double-sided tape 138 is formed over carrier 136 as a temporary adhesive bonding film or etch-stop layer.

In FIG. 4b, semiconductor die 124 from FIGS. 3a-3c is positioned over interface layer 138 and carrier 136 with active surface 130 and conductive layer 132 oriented toward the carrier. FIG. 4c shows semiconductor die 124 mounted to interface layer 138 and carrier 136 as part of a reconstituted or reconfigured wafer level package.

In FIG. 4d, an encapsulant or molding compound 140 is deposited over semiconductor die 124 and carrier 136 using a paste printing, compressive molding, transfer molding, liquid encapsulant molding, vacuum lamination, spin coating, or other suitable applicator. Encapsulant 140 can be polymer composite material, such as epoxy resin with filler, epoxy acrylate with filler, or polymer with proper filler. Encapsulant 140 is non-conductive and environmentally protects the semiconductor device from external elements and contaminants.

In FIG. 4e, carrier 136 and interface layer 138 are removed by chemical etching, mechanical peeling, CMP, mechanical grinding, thermal bake, UV light, laser scanning, or wet stripping to expose active surface 130 and conductive layer 132.

In FIG. 4f, an insulating or passivation layer 142 is formed over active surface 130 and conductive layer 132 using PVD, CVD, printing, spin coating, spray coating, sintering or thermal oxidation. The insulating layer 142 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 142 is removed by an etching process through a photoresist layer (not shown) to expose conductive layer 132.

In FIG. 4g, an electrically conductive layer or redistribution layer (RDL) 144 is formed over insulating layer 142 and the exposed conductive layer 132 using a patterning and metal deposition process such as printing, PVD, CVD, sputtering, electrolytic plating, and electroless plating. Conductive layer 144 can be one or more layers of Al, Cu, Sn, Ni, Au, Ag, or other suitable electrically conductive material. One portion of conductive layer 144 is electrically connected to conductive layer 132 of semiconductor die 124. Other portions of conductive layer 144 can be electrically common or electrically isolated depending on the design and function of semiconductor die 124. In particular, conductive layer 144 extends outward from conductive layer 132 to redistribute electrical signals to a point over encapsulant 140 beyond a footprint of semiconductor die 124.

FIG. 4h shows semiconductor die 146 originating from a semiconductor wafer similar to FIGS. 3a-3c. Semiconductor die 146 has a back surface 148 and active surface 150 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 150 to implement analog circuits or digital circuits, such as DSP, ASIC, memory, or other signal processing circuit. Semiconductor die 146 may also contain IPDs, such as inductors, capacitors, and resistors, for RF signal processing. A plurality of contact pads 152 is formed on active surface 150 electrically connected to the circuits on the active surface. Semiconductor die 146 may have the same size or electrical function as semiconductor die 124, such as a memory device, or a different size or electrical function than semiconductor die 124.

Semiconductor die 146 is positioned over insulating layer 142 and conductive layer 144 with back surface 148 oriented toward insulating layer 142 over semiconductor die 124. FIG. 4i shows semiconductor die 146 mounted to insulating layer 142 and conductive layer 144 of semiconductor die 124 with die attach adhesive 154 as part of the reconstituted or reconfigured wafer level package.

In FIG. 4j, an encapsulant or molding compound 156 is deposited over semiconductor die 146, insulating layer 142, and conductive layer 144 using a paste printing, compressive molding, transfer molding, liquid encapsulant molding, vacuum lamination, spin coating, or other suitable applicator. Encapsulant 156 can be polymer composite material, such as epoxy resin with filler, epoxy acrylate with filler, or polymer with proper filler. In one embodiment, encapsulant 140 is thicker than encapsulant 156, as described in FIGS. 8a-8b. Encapsulant 156 is non-conductive and environmentally protects the semiconductor device from external elements and contaminants.

In FIG. 4k, an insulating or passivation layer 158 is formed over active surface 150 and conductive layer 152 of semiconductor die 146 using PVD, CVD, printing, spin coating, spray coating, sintering or thermal oxidation. The insulating layer 158 contains one or more layers of SiO2, Si3N4, SiON, Ta2O5, Al2O3, or other material having similar insulating and structural properties. A portion of insulating layer 158 is removed by an etching process through a photoresist layer to expose conductive layer 152.

An electrically conductive layer or RDL 160 is formed over insulating layer 158 and the exposed conductive layer 152 using a patterning and metal deposition process such as printing, PVD, CVD, sputtering, electrolytic plating, and electroless plating. Conductive layer 160 can be one or more layers of Al, Cu, Sn, Ni, Au, Ag, or other suitable electrically conductive material. One portion of conductive layer 160 is electrically connected to conductive layer 152 of semiconductor die 146. Other portions of conductive layer 160 can be electrically common or electrically isolated depending on the design and function of semiconductor die 146. In particular, conductive layer 160 extends outward from conductive layer 152 to redistribute electrical signals to a point over encapsulant 156 beyond a footprint of semiconductor die 146.

FIG. 4l shows semiconductor die 166 originating from a semiconductor wafer similar to FIGS. 3a-3c. Semiconductor die 166 has a back surface 168 and active surface 170 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 170 to implement analog circuits or digital circuits, such as DSP, ASIC, memory, or other signal processing circuit. Semiconductor die 166 may also contain IPDs, such as inductors, capacitors, and resistors, for RF signal processing. A plurality of contact pads 172 is formed on active surface 170 electrically connected to the circuits on the active surface. Semiconductor die 166 may have the same size or electrical function as semiconductor die 124 and 146, such as a memory device, or a different size or electrical function than semiconductor die 124 and 146.

Semiconductor die 166 is positioned over insulating layer 158 and conductive layer 160 with back surface 168 oriented toward insulating layer 158 over semiconductor die 146. FIG. 4m shows semiconductor die 166 mounted to insulating layer 158 and conductive layer 160 of semiconductor die 146 with die attach adhesive 174 as part of the reconstituted or reconfigured wafer level package.

In FIG. 4n, an encapsulant or molding compound 176 is deposited over semiconductor die 166, insulating layer 158, and conductive layer 160 using a paste printing, compressive molding, transfer molding, liquid encapsulant molding, vacuum lamination, spin coating, or other suitable applicator. Encapsulant 176 can be polymer composite material, such as epoxy resin with filler, epoxy acrylate with filler, or polymer with proper filler. In one embodiment, encapsulant 156 is thicker than encapsulant 176, as described in FIGS. 8a-8b. Encapsulant 176 is non-conductive and environmentally protects the semiconductor device from external elements and contaminants.

In FIG. 4o, an insulating or passivation layer 178 is formed over active surface 170 and conductive layer 172 of semiconductor die 166 using PVD, CVD, printing, spin coating, spray coating, sintering or thermal oxidation. The insulating layer 178 contains one or more layers of SiO2, Si3N4, SiON, Ta2O5, Al2O3, or other material having similar insulating and structural properties. A portion of insulating layer 178 is removed by an etching process through a photoresist layer to expose conductive layer 172.

An electrically conductive layer or RDL 180 is formed over insulating layer 178 and the exposed conductive layer 172 using a patterning and metal deposition process such as printing, PVD, CVD, sputtering, electrolytic plating, and electroless plating. Conductive layer 180 can be one or more layers of Al, Cu, Sn, Ni, Au, Ag, or other suitable electrically conductive material. One portion of conductive layer 180 is electrically connected to conductive layer 172 of semiconductor die 166. Other portions of conductive layer 180 can be electrically common or electrically isolated depending on the design and function of semiconductor die 166. In particular, conductive layer 180 extends outward from conductive layer 172 to redistribute electrical signals to a point over encapsulant 176 beyond a footprint of semiconductor die 166.

In FIG. 4p, a plurality of vias is formed continuously through encapsulants 140, 156, and 176, outside a footprint of semiconductor die 124, 146, and 166, using laser drilling, mechanical drilling, or deep reactive ion etching (DRIE). The vias also extend through insulating layers 142, 158, and 178, and conductive layer 144, 160, and 180. The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction vertical interconnect conductive vias 182. Conductive vias 182 are electrically connected to conductive layer 144, 160, and 180 to route electrical signal between semiconductor die 124, 146, and 166, as well as to external devices.

In another embodiment, conductive vias 183 are formed through individual encapsulant layers 140, 156, and 176 after each encapsulant is deposited, as shown in FIG. 4q. For example, conductive vias 183 are formed through encapsulant 140, insulating layer 142, and conductive layer 144 after the encapsulant is deposited in FIG. 4g. Conductive vias 183 are formed through encapsulant 156, insulating layer 158, and conductive layer 160 after the encapsulant is deposited in FIG. 4k. Conductive vias 183 are formed through encapsulant 176, insulating layer 178, and conductive layer 180 after the encapsulant is deposited in FIG. 4o.

Additional semiconductor die, like die 146 and 166, can be stacked within the reconstituted or reconfigured wafer level package and electrically connected through conductive vias 182 or 183 and conductive layers like 160 and 180.

In FIG. 4r, a build-up interconnect structure 184 is formed over insulating layer 178 and conductive layer 180 of semiconductor die 166. The build-up interconnect structure 184 can also be formed over insulating layer 158 and conductive layer 160 of semiconductor die 146 in a reconstituted or reconfigured wafer level package containing two stacked semiconductor die 124 and 146. The build-up interconnect structure 184 includes electrically conductive layer or RDL 186 formed over insulating layer 178 using a patterning and metal deposition process such as sputtering, electrolytic plating, and electroless plating. Conductive layer 186 can be one or more layers of Al, Cu, Sn, Ni, Au, Ag, or other suitable electrically conductive material. One portion of conductive layer 186 is electrically connected to conductive layer 180. Other portions of conductive layer 186 can be electrically common or electrically isolated depending on the design and function of semiconductor die 124, 146, and 166.

An insulating or passivation layer 188 is formed over insulating layer 178 and conductive layers 180 and 186 for electrical isolation using PVD, CVD, printing, spin coating, spray coating, sintering or thermal oxidation. The insulating layer 188 contains one or more layers of SiO2, Si3N4, SiON, Ta2O5, Al2O3, or other material having similar insulating and structural properties. A portion of insulating layer 188 is removed by an etching process through a photoresist layer to expose conductive layer 186.

In FIG. 4s, an electrically conductive layer 190 is formed over insulating layer 188 and the exposed conductive layers 180 and 186 using a patterning and metal deposition process such as printing, PVD, CVD, sputtering, electrolytic plating, and electroless plating. Conductive layer 190 can be one or more layers of Al, Cu, Sn, Ni, Au, Ag, or other suitable electrically conductive material. Conductive layer 190 operates as an under bump metallization (UBM) layer electrically connected to conductive layers 180 and 186 and conductive vias 182.

An electrically conductive bump material is deposited over build-up interconnect structure 184 and electrically connected to conductive layer 190 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 190 using a suitable attachment or bonding process. In one embodiment, the bump material is reflowed by heating the material above its melting point to form spherical balls or bumps 192. In some applications, bumps 192 are reflowed a second time to improve electrical contact to conductive layer 190. Bumps 192 can also be compression bonded to conductive layer 190. Bumps 192 represent one type of interconnect structure that can be formed over conductive layer 190. The interconnect structure can also use stud bump, micro bump, or other electrical interconnect.

The reconstituted or reconfigured wafer level package is singulated through encapsulant 140, 156, and 166 between semiconductor die 124, 146, and 166 using a saw blade or laser cutting tool 196 into individual embedded wafer level ball grid array (eWLB) package 198.

Figure 5:
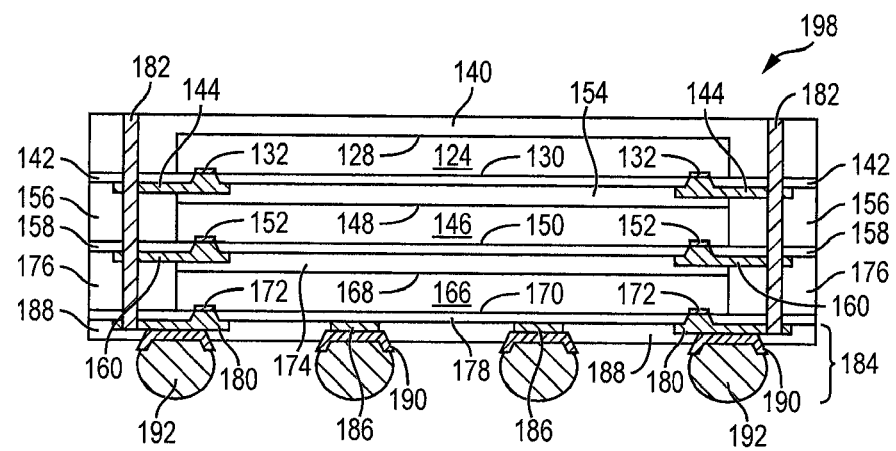
FIG. 5 illustrates the eWLB package containing stacked semiconductor die electrically connected through conductive vias formed in an encapsulant around each of the semiconductor die.

FIG. 5 shows eWLB package 198 after singulation. The stacked semiconductor die 124, 146, and 166 are electrically connected through conductive layers 144, 160, and 180, and conductive vias 182 formed through encapsulants 140, 156, and 176 outside a footprint of the stacked semiconductor die. The stacked semiconductor die 124, 146, and 166 can also be configured as a wafer level chip scale package (WLCSP). The build-up interconnect structure 184 enables electrical connection to external devices. Semiconductor die 124, 146, and 166 can have similar size or similar electrical function, e.g., memory devices, or different size or similar electrical function. Conductive layers 144, 160, and 180, and conductive vias 182 of eWLB package 194 supports a high interconnect capacity. Each level of encapsulants 140, 156, and 176 may have a different thickness, e.g., encapsulant 140 thicker than encapsulant 156, and encapsulant 156 thicker than encapsulant 176.

Figure 6:
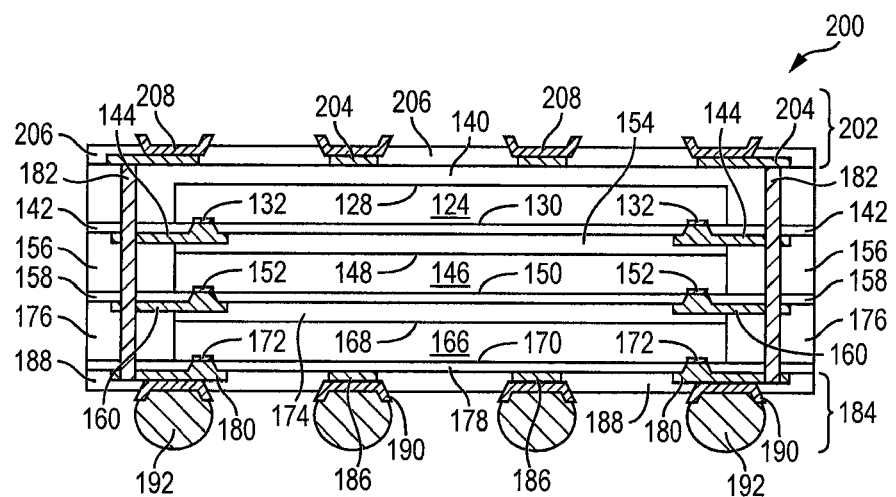
FIG. 6 illustrates a build-up interconnect structure formed over the eWLB package.

FIG. 6 shows another embodiment of eWLB semiconductor package 200 with a build-up interconnect structure 202 formed over encapsulant 140 of semiconductor die 124, opposite build-up interconnect structure 184, for package-on-package (PoP) applications. The build-up interconnect structure 202 includes electrically conductive layer or RDL 204 formed over encapsulant 140 using a patterning and metal deposition process such as sputtering, electrolytic plating, and electroless plating. Conductive layer 204 can be one or more layers of Al, Cu, Sn, Ni, Au, Ag, or other suitable electrically conductive material. One portion of conductive layer 204 is electrically connected to conductive vias 182. Other portions of conductive layer 204 can be electrically common or electrically isolated depending on the design and function of semiconductor die 124, 146, and 166.

An insulating or passivation layer 206 is formed over encapsulant 140 and conductive layer 204 for electrical isolation using PVD, CVD, printing, spin coating, spray coating, sintering or thermal oxidation. The insulating layer 206 contains one or more layers of $SiO_2$, $Si_3N_4$, SiON, $Ta_2O_5$, $Al_2O_3$, or other material having similar insulating and structural properties. A portion of insulating layer 206 is removed by an etching process through a photoresist layer to expose conductive layer 204.

An electrically conductive layer 208 is formed over insulating layer 206 and the exposed conductive layer 204 using a patterning and metal deposition process such as printing, PVD, CVD, sputtering, electrolytic plating, and electroless plating. Conductive layer 208 can be one or more layers of Al, Cu, Sn, Ni, Au, Ag, or other suitable electrically conductive material. Conductive layer 208 operates as a UBM layer electrically connected to conductive layer 204.

Figure 7:
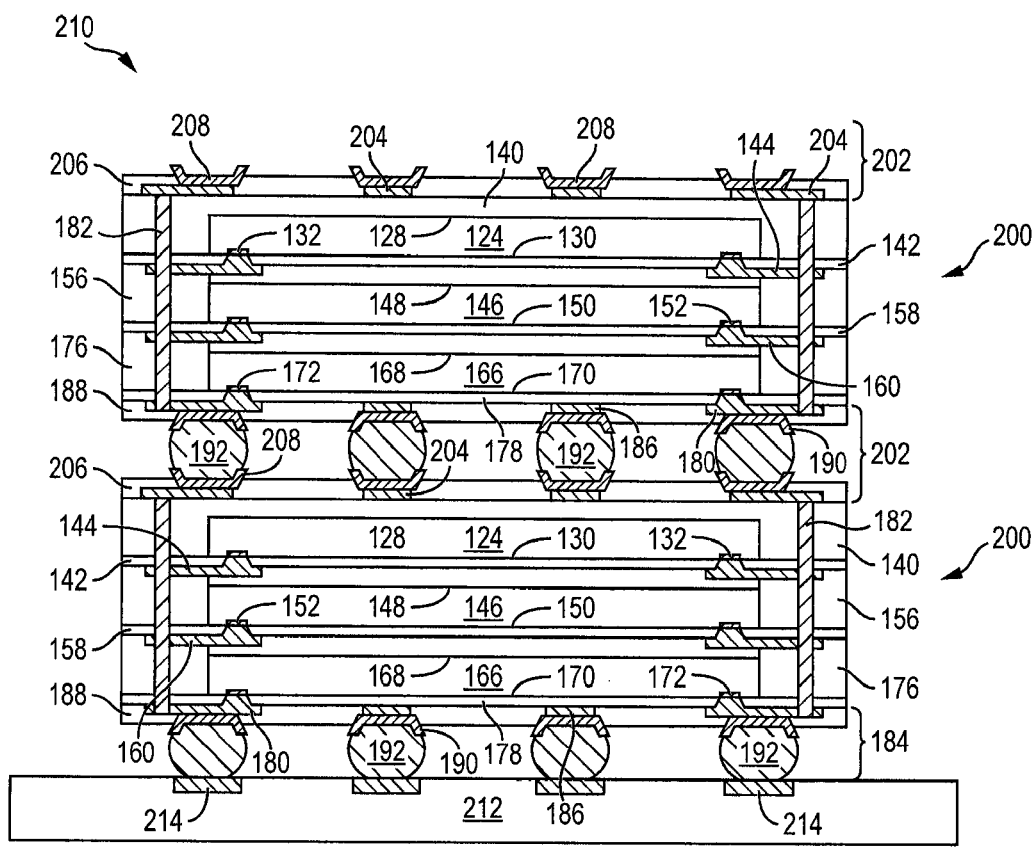
FIG. 7 illustrates a PoP arrangement with stacked eWLB packages mounted to a substrate.

FIG. 7 shows a PoP arrangement 210 with two stacked eWLB or WLSCP semiconductor packages 200, each containing stacked semiconductor die 124, 146, and 166, electrically connected through conductive layers 144, 160, and 180, conductive vias 182, and build-up interconnect structures 184 and 202. Bumps 192 of the upper eWLB are electrically connected to conductive layer 208 of the lower eWLB. The stacked eWLB packages 200 are mounted to substrate or PCB 212 with bumps 192 of the lower EWLB metallurgically and electrically connected to conductive traces 214 formed on the substrate. Semiconductor die 124, 146, and 166 can have similar size or similar electrical function, e.g., memory devices, or different size or similar electrical function. Conductive layers 144, 160, and 180, and conductive vias 182 of eWLB package 194 support a high interconnect capacity.

FIG. 8a shows a chase mold 220 having an upper mold support 222 and lower mold support 224 are brought together to enclose an arrangement of stacked semiconductor die, such as the arrangement shown in FIG. 4i with semiconductor die 146 mounted to semiconductor die 124 and encapsulant 140 formed around semiconductor die 124. An open space 226 is provided around semiconductor die 146. Compressible releasing film 228 conforms to active surface 150 of semiconductor die 146 to block formation of encapsulant on these surfaces. An encapsulant 156 in a liquid state is injected into one side of chase mold 220 with nozzle 230 while an optional vacuum assist 232 draws pressure from the opposite side to uniformly fill open space 226 around semiconductor die 146 with the encapsulant, as shown in FIG. 8a. Encapsulant 156 is formed around semiconductor die 146 and cured, as shown in FIGS. 8b and 4j. By using an appropriately sized upper mold support 224, open space 226 can be made more or less in height to determine the thickness of encapsulant 156. In one embodiment, encapsulant 140 is thicker than encapsulant 156.

Chase mold 220 can also be used to deposit encapsulant 176 around semiconductor die 166 in the arrangement of FIG. 4m by using appropriately sized upper and lower mold supports. Encapsulant 176 in a liquid state is injected into one side of chase mold 220 while an optional vacuum draws pressure from the opposite side to uniformly fill the open space around semiconductor die 166 with the encapsulant, similar to FIG. 8a. Encapsulant 176 is formed around semiconductor die 166 and cured, as shown in FIGS. 8b and 4n. By using an appropriately sized upper and lower mold supports, the open space can be made more or less in height to determine the thickness of encapsulant 176. In one embodiment, encapsulant 156 is thicker than encapsulant 176.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first semiconductor die including a contact pad formed on a surface of the first semiconductor die;
   depositing a first encapsulant over the first semiconductor die while leaving the surface of the first semiconductor die devoid of the first encapsulant;
   forming a first conductive layer over the first encapsulant and extending to the contact pad of the first semiconductor die;
   providing a second semiconductor die including a contact pad formed on a surface of the second semiconductor die;
   disposing the second semiconductor die over the first semiconductor die;
   depositing a second encapsulant over the first encapsulant and second semiconductor die after disposing the second semiconductor die over the first semiconductor die while leaving the surface of the second semiconductor die devoid of the second encapsulant; and forming a second conductive layer over the second encapsulant and extending to the contact pad of the second semiconductor die.

2. The method of claim 1, further including forming a conductive via through the first encapsulant and second encapsulant and electrically connected to the first conductive layer and second conductive layer.

3. The method of claim 2, further including:
stacking a plurality of semiconductor devices; and
electrically connecting the stacked semiconductor devices through the conductive via.

4. The method of claim 1, further including:
disposing a third semiconductor die over the second semiconductor die;
depositing a third encapsulant over the third semiconductor die; and
forming a third conductive layer over the third encapsulant.

5. The method of claim 1, further including forming an interconnect structure over the first semiconductor die or second semiconductor die.

6. The method of claim 1, wherein the first encapsulant includes a thickness different from a thickness of the second encapsulant.

7. A method of making a semiconductor device, comprising:
providing a first semiconductor die including a contact pad formed on a surface of the first semiconductor die;
depositing a first encapsulant over the first semiconductor die and planar with the surface of the first semiconductor die;
forming a first conductive layer over the first encapsulant;
disposing a second semiconductor die over the first semiconductor die;
depositing a second encapsulant over the second semiconductor die and over the first encapsulant after disposing the second semiconductor die over the first semiconductor die;
forming a second conductive layer over the second encapsulant; and
forming a conductive via through the first encapsulant, first conductive layer, second conductive layer, and second encapsulant.

8. The method of claim 7, further including:
disposing a third semiconductor die over the second semiconductor die;
depositing a third encapsulant over the third semiconductor die;
forming a third conductive layer over the third encapsulant; and
forming the conductive via through the first conductive layer, second conductive layer, and third conductive layer.

9. The method of claim 7, further including forming an interconnect structure over the first semiconductor die or second semiconductor die.

10. The method of claim 7, further including:
stacking a plurality of semiconductor devices; and
electrically connecting the stacked semiconductor devices through the conductive via.

11. The method of claim 7, further including:
forming a contact pad on a surface of the second semiconductor die; and depositing the second encapsulant over the second semiconductor die while blocking formation of the second encapsulant over the surface of the second semiconductor die.

12. A semiconductor device, comprising:
a first semiconductor die;
a first encapsulant deposited over the first semiconductor die;
a first conductive layer formed over the first encapsulant;
a second semiconductor die including a contact pad formed on a surface of the second semiconductor die, wherein the second semiconductor die is disposed over the first semiconductor die;
a second encapsulant deposited in direct contact with the first conductive layer and over the second semiconductor die leaving the surface of the second semiconductor die devoid of the second encapsulant; and
a second conductive layer formed over the second encapsulant and extending to the contact pad of the second semiconductor die.

13. The semiconductor device of claim 12, further including a conductive via formed through the first encapsulant and second encapsulant and electrically connected to the first conductive layer and second conductive layer.

14. The semiconductor device of claim 13, further including a plurality of stacked semiconductor devices electrically connected through the conductive via.

15. The semiconductor device of claim 12, further including:
a third semiconductor die disposed over the second semiconductor die;
a third encapsulant deposited over the third semiconductor die; and
a third conductive layer formed over the third encapsulant and electrically connected to the third semiconductor die.

16. The semiconductor device of claim 12, further including an interconnect structure formed over the first semiconductor die or second semiconductor die.

17. The semiconductor device of claim 12, wherein the first encapsulant includes a thickness different from a thickness of the second encapsulant.

18. A method of making a semiconductor device, comprising:
providing a first semiconductor die;
depositing a first encapsulant over the first semiconductor;
providing a second semiconductor die including a contact pad formed on a surface of the second semiconductor die;
disposing the second semiconductor die over the first semiconductor die;
depositing a second encapsulant over the second semiconductor die after disposing the second semiconductor die over the first semiconductor die leaving the surface of the second semiconductor dies devoid of the second encapsulant; and
forming a conductive layer over the second encapsulant and extending to a contact pad of the second semiconductor die.

19. The method of claim 18, further including forming a conductive via through the first encapsulant and second encapsulant and electrically connected to the conductive layer.

20. The method of claim 19, further including:
stacking a plurality of semiconductor devices; and
electrically connecting the stacked semiconductor devices through the conductive via.

21. The method of claim 18, further including forming an interconnect structure over the first semiconductor die or second semiconductor die.

22. The method of claim 18, further including:
- forming a contact pad on a surface of the first semiconductor die; and
- depositing the first encapsulant over the first semiconductor die while blocking formation of the first encapsulant over the surface of the first semiconductor die.

23. A method of making a semiconductor device, comprising:
- providing a first semiconductor die;
- depositing a first encapsulant over the first semiconductor;
- disposing a second semiconductor die over the first semiconductor die; and
- depositing a second encapsulant over the second semiconductor die after disposing the second semiconductor die over the first semiconductor die.

24. The method of claim 23, further including forming a conductive layer over the second encapsulant.

25. The method of claim 23, further including forming a conductive via through the first encapsulant and second encapsulant.

26. The method of claim 25, further including:
- stacking a plurality of semiconductor devices; and
- electrically connecting the stacked semiconductor devices through the conductive via.

27. The method of claim 23, further including forming an interconnect structure over the first semiconductor die or second semiconductor die.

* * * * *